United States Patent
Hiyama

(10) Patent No.: US 10,833,669 B2
(45) Date of Patent: Nov. 10, 2020

(54) SEMICONDUCTOR DEVICE, INVERTER, AND AUTOMOBILE

(71) Applicant: Mitsubishi Electric Corporation, Tokyo (JP)

(72) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/461,664

(22) PCT Filed: Dec. 22, 2016

(86) PCT No.: PCT/JP2016/088455
§ 371 (c)(1),
(2) Date: May 16, 2019

(87) PCT Pub. No.: WO2018/116458
PCT Pub. Date: Jun. 28, 2018

(65) Prior Publication Data
US 2020/0067502 A1    Feb. 27, 2020

(51) Int. Cl.
*H02M 7/5387*    (2007.01)
*H02P 27/08*    (2006.01)
(Continued)

(52) U.S. Cl.
CPC .. *H03K 17/08122* (2013.01); *H02M 7/53871* (2013.01); *H02P 27/08* (2013.01);
(Continued)

(58) Field of Classification Search
None
See application file for complete search history.

(56) References Cited

U.S. PATENT DOCUMENTS

| | | | | |
|---|---|---|---|---|
| 5,099,138 A | * | 3/1992 | Fukunaga | H02M 1/38 326/21 |
| 7,294,992 B2 | * | 11/2007 | Yoshikawa | H02M 1/38 323/222 |

(Continued)

FOREIGN PATENT DOCUMENTS

| | | |
|---|---|---|
| JP | H03-169273 A | 7/1991 |
| JP | 2004-166207 A | 6/2004 |

(Continued)

OTHER PUBLICATIONS

International Search Report issued in PCT/JP2016/088455; dated Feb. 28, 2017.

(Continued)

*Primary Examiner* — Bickey Dhakal
(74) *Attorney, Agent, or Firm* — Studebaker & Brackett PC

(57) ABSTRACT

The present invention relates to a semiconductor device provided with a dead-time generation circuit, the semiconductor device including: first and second status-detection circuits that each have a function of detecting whether first and second switching devices are in turn-off operation to output first and second status signals, respectively, and each have a function of generating a dead time of on-off operation of the corresponding one of the first and second switching devices; a first logic circuit that receives a first on-off command signal instructing the first switching device to be turned on or off, and the second status signal to output a signal allowing the first switching device to be turned on only when the second switching device is not in turn-off operation; and a second logic circuit that receives the first on-off command signal instructing the second switching device to be turned on or off, and the first status signal to output a signal allowing the second switching device to be (Continued)

turned on only when the first switching device is not in turn-off operation.

10 Claims, 9 Drawing Sheets

(51) Int. Cl.
*H03K 17/0812* (2006.01)
*H02P 29/024* (2016.01)

(52) U.S. Cl.
CPC .......... *H02P 29/024* (2013.01); *H02P 29/027* (2013.01); *H02P 29/0241* (2016.02)

(56) References Cited

U.S. PATENT DOCUMENTS

| | | | |
|---|---|---|---|
| 9,166,469 B2* | 10/2015 | Familiant | ................ H02M 1/38 |
| 9,455,566 B2 | 9/2016 | Hiyama | |
| 2004/0041619 A1* | 3/2004 | Nadd | .................... H02M 1/088 |
| | | | 327/436 |
| 2005/0200384 A1 | 9/2005 | Nadd | |
| 2007/0040383 A1* | 2/2007 | Mehl | ..................... F02N 11/006 |
| | | | 290/36 R |

FOREIGN PATENT DOCUMENTS

| | | |
|---|---|---|
| JP | 2005-217774 A | 8/2005 |
| JP | 5801001 B2 | 9/2015 |

OTHER PUBLICATIONS

An Office Action; "Notice of Reasons for Refusal," issued by the Japanese Patent Office dated Jul. 9, 2019, which corresponds to Japanese Patent Application No. 2018-557490 and is related to U.S. Appl. No. 16/461,664; with English Translation.

An Office Action mailed by the China National Intellectual Property Administration dated Jul. 23, 2020, which corresponds to Chinese Patent Application No. 201680091683.3 and is related to U.S. Appl. No. 16/461,664 with English language translation.

* cited by examiner

SEMICONDUCTOR DEVICE, INVERTER, AND AUTOMOBILE

TECHNICAL FIELD

The present invention relates to a semiconductor device including a dead-time generation circuit connected in series to generate a dead time in driving of a switching device that operates complementarily.

BACKGROUND ART

In driving control of a switching device connected between a high potential power supply terminal and a low potential power supply terminal to form a totem-pole connection and operate complementarily, it is conventionally required to prevent a problem in that a high-potential-side switching device connected to the high potential power supply terminal and a low-potential-side switching device connected to the low potential power supply terminal are turned on at the same time to cause a short circuit between the high potential power supply terminal and the low potential power supply terminal, thereby causing an excessively large through-current to flow into the high-potential-side switching device and the low-potential-side switching device.

For example, in Patent Document 1, there are provided monitor circuits that monitor respective on-off states of a high-potential side switching device and a low-potential side switching device to input monitor signals to respective determination circuits. There is disclosed a configuration in which each of the determination circuits receives an on-off signal of the corresponding one of the switching devices and a monitor signal of the opposing switching device to output an on-off signal to the corresponding one of the switching devices on the basis of the monitor signal.

While the determination circuit disclosed in Patent Document 1 is configured so as not to provide an ON signal to a switching device corresponding to itself when an ON signal is provided to an opposing switching device, a recent electric power apparatus includes a protection circuit having a detection circuit for detecting an abnormality such as excessive output current due to a short-circuit of a load, and a soft shut-off circuit for safely turning off a switching device, as disclosed in Patent Document 2.

As a method for performing soft shut-off, a method for increasing a gate resistor value more than that in normal turn-off is often used, as disclosed in Patent Document 2.

PRIOR ART DOCUMENTS

Patent Documents

Patent Document 1: Japanese Patent Application Laid-Open No. 03-169273
Patent Document 2: Japanese Patent No. 5801001

SUMMARY

Problem to be Solved by the Invention

When the protection circuit detects an abnormality and a soft shut-off function works, time from start to execution of shut-off of the switching device increases more than normal turn-off time. Thus, when the protection circuit is operated immediately before on-off of the switching device is switched, even when an appropriate dead time is provided, an excessive through-current may flow in the high potential side switching device and the low potential side switching device due to a short-circuit (arm short) between the high potential power supply terminal and the low potential power supply terminal, being caused by another switching device that is turned on before shut-off of the switching device during soft shut-off operation is completed.

The present invention is made to solve the problem described above, and it is an object of the present invention to provide a semiconductor device including a dead-time generation circuit capable of reliably preventing an arm short even during operation of a soft shut-off function of a protection circuit.

Means to Solve the Problem

A semiconductor device according to the present invention includes the following: first and second switching devices connected in series between a first potential and a second potential lower than the first potential to operate complementarily; a first gate driving circuit that performs driving control of the first switching device; a second gate driving circuit that performs driving control of the second switching device; a first status-detection circuit having functions of not only detecting whether the first switching device is in turn-off operation to output a result of the detection as a first status signal, but also generating a dead time of on-off operation of each of the first and second switching devices; a second status-detection circuit having functions of not only detecting whether the second switching device is in turn-off operation to output a result of the detection as a second status signal, but also generating a dead time of on-off operation of each of the first and second switching devices; first and second input terminals to which first and second on-off command signals for turning on and off the first and second switching devices are input, respectively; a first logic circuit that receives the first on-off command signal and the second status signal, and that outputs the first on-off command signal as a signal for turning on the first switching device only when the second status signal indicates that the second switching device is not in turn-off operation; and a second logic circuit that receives the second on-off command signal and the first status signal, and that outputs the second on-off command signal as a signal for turning on the second switching device only when the first status signal indicates that the second switching device is not in turn-off operation.

Effects of the Invention

The semiconductor device according to the present invention enables obtaining a semiconductor device including a dead-time generation circuit capable of reliably preventing an arm short.

DESCRIPTION OF EMBODIMENTS

<Introduction>

Prior to description of embodiments of the present invention, a dead time in driving of a switching device that operates complementarily will be described.

Figure 1:
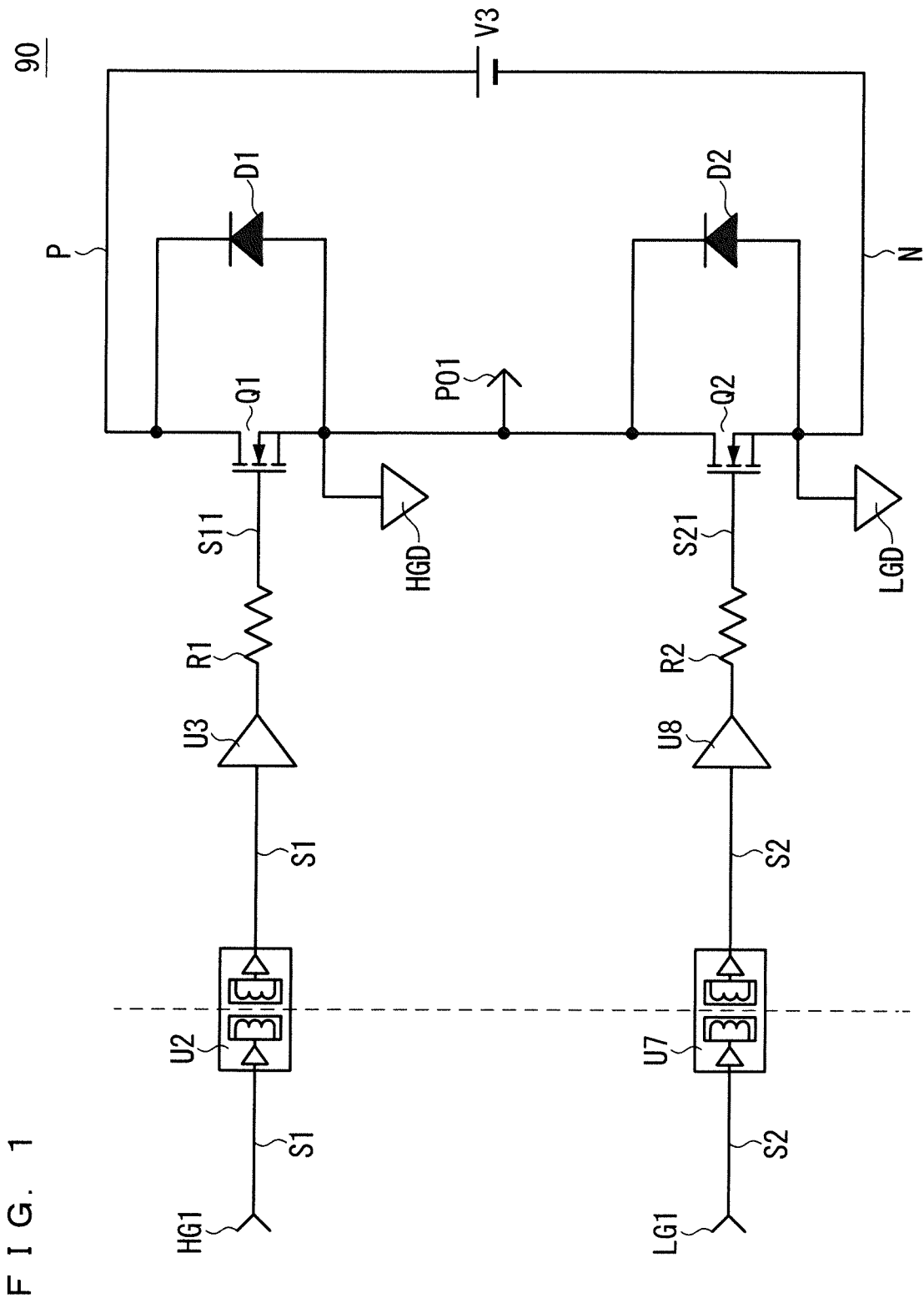
FIG. 1 is a diagram illustrating a dead time in driving of a switching device that operates complementarily.

FIG. 1 is a circuit diagram illustrating a configuration of a half-bridge circuit 90. Two sets of the half-bridge circuit of FIG. 1 are connected in parallel to form an H bridge circuit, and three sets thereof are connected in parallel to form a three phase inverter.

As illustrated in FIG. 1, the half-bridge circuit 90 includes transistors Q1 and Q2 that are switching devices such as metal oxide semiconductor (MOS) transistors and connected in series between P-N wires (between a main power supply wire P (upper arm) of high potential and a main power supply wire N (lower arm) of low potential) connected to a high-voltage power supply V3 to serve as main power supply lines.

The transistor Q1 is an N channel type MOS transistor connected at its drain to a positive electrode of the high-voltage power supply V3, and the transistor Q2 is an N channel type MOS transistor connected at its source to a negative electrode of the high-voltage power supply V3. A connection node between the drain of the transistor Q1 and the source of the transistor Q2 is an output node PO1.

The transistors Q1 and Q2 are each a voltage control type power device, and turned on and off by control using gate voltage applied to a gate electrode. Diodes D1 and D2 are connected in anti-parallel to the transistors Q1 and Q2, respectively. Each of the diodes serves as a freewheel diode through which a free wheel current flows when an inductive load is connected. When the transistors Q1 and Q2 are each a MOS transistor, a built-in parasitic diode (body diode) can be used as a freewheel diode, and thus the diodes D1 and D2 may not be provided in some cases.

The transistors Q1 and Q2 are connected at their gates to gate resistors R1 and R2 for adjusting switching speed of the transistors Q1 and Q2, respectively. Then, gate signals S11 and S21 are given to the gates of the transistors Q1 and Q2 from gate driving buffer U3 and U8 (gate driving circuit) via the gate resistors R1 and R2, respectively.

The transistors Q1 and Q2 connected to the high-voltage power supply V3, and the gate driving buffers U3 and U8 of the corresponding transistors are on a high-voltage side with respect to the high-voltage power supply V3. Then, the transistors Q1 and Q2 are connected at their sources to reference potentials HGD and LGD with reference to the high-voltage power supply V3, respectively, so that they are each called a high-voltage section, and are each electrically insulated from a low-voltage section that is on a low-potential side.

To provide gate on-off command signals S1 and S2 received from signal input terminals HG1 and LG1 of the low-voltage section to the gate driving buffer U3 and U8 of the high-voltage section, respectively, digital isolator U2 and U7 are each used as an insulating element. That is, inputs of the digital isolators U2 and U7 are provided with the gate on-off command signals S1 and S2 from the signal input terminals HG1 and LG1, respectively, and inputs of the gate driving buffers U3 and U8 are provided with the gate on-off command signals S1 and S2 insulated from the low-voltage section, via the digital isolators U2 and U7, respectively.

A digital isolator is classified as one type of magnetic coupler, and achieves an insulating function similar to that of a photo coupler to perform isolation by using magnetic coupling. While an example in which a digital isolator is used as an insulating element will be described in the following description, a photo coupler may be used for electrical insulation between the low-voltage section and the high-voltage section in the present invention, and the insulating element is not limited to a magnetic coupler (including a digital isolator).

The digital isolator is configured to transmit a signal using a pair of magnetic coils in which micro coils produced in a semiconductor manufacturing process face each other with an insulator interposed therebetween.

Figure 2:
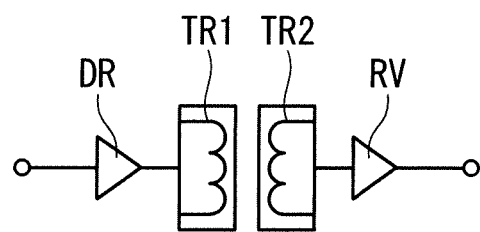
FIG. 2 is a diagram schematically illustrating a configuration of a digital isolator.

FIG. 2 schematically illustrates an example of a configuration of the digital isolator. As illustrated in FIG. 2, the digital isolator includes a primary-side coil TR1 and a secondary-side coil TR2, disposed facing each other, a driver circuit DR connected to the primary-side coil TR1, and a receiver circuit RV connected to the secondary-side coil TR2. The insulator between the primary-side coil TR1 and the secondary-side coil TR2 is eliminated.

Signal (digital signal) transmission is performed such that the driver circuit DR detects a rising edge or a falling edge of a digital signal received to transmit it as a pulse signal to the secondary-side coil TR2 using the magnetic coupling between the primary-side coil TR1 and the secondary-side coil TR2. The receiver circuit RV restores the rising edge or the falling edge of the digital signal according to the received pulse signal. The configuration of the digital isolator is not limited to the above, and the configurations and functions of the driver circuit and the receiver circuit are also not limited to the above.

Figure 3:
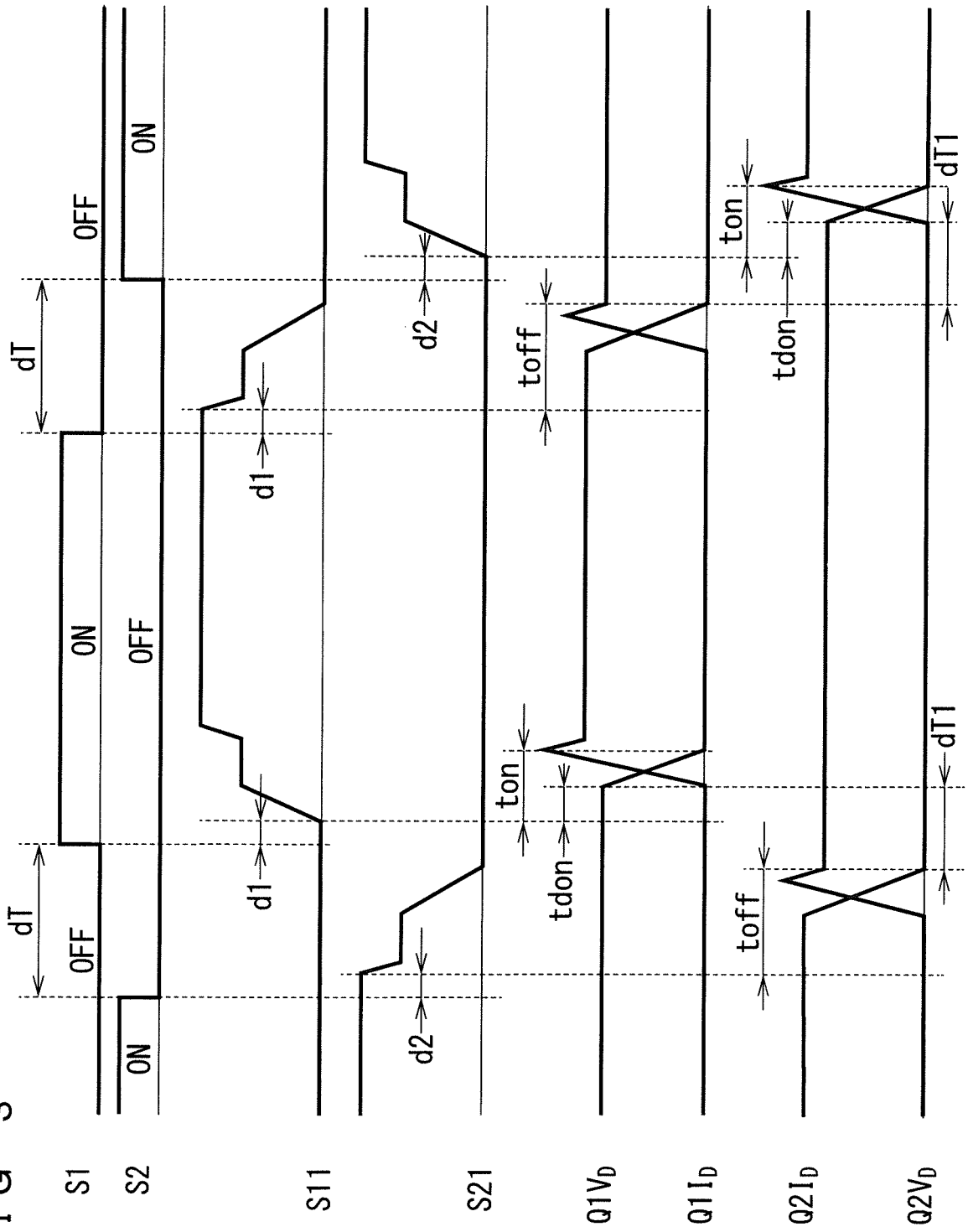
FIG. 3 is a timing chart illustrating a dead time in driving of a switching device that operates complementarily.

FIG. 3 is a timing chart illustrating switching operation of the half-bridge circuit 90. Typically, time (turn-off time toff) required for turning-off for switching a switching device from an on state to an off state is longer than time (turn-on time ton) required for turning-on for switching the switching device from the off state to the on state. Then, as a resistance value of each of the gate resistors R1 and R2 increases, the turn-on time ton and the turn-off time toff increase. In addition, depending on variations of electrical characteristics of the transistors Q1 and Q2, and operating conditions such as junction temperature, the turn-on time ton and the turn-off time toff increase or decrease.

The transistor Q1 and the transistor Q2 are alternately (complementarily) turned on to control output voltage of the half-bridge circuit using pulse width modulation (PWM), and when on-off states of the respective transistors Q1 and Q2 are switched at the same time, both of the transistors Q1 and Q2 are turned on at the same time to cause an arm short.

To prevent an arm short, timing of the gate on-off command signals S1 and S2 is controlled such that one of the gate on-off command signals is not turned on until a certain time (dead time) elapses after the other of the gate on-off command signals S1 and S2 is turned off, as illustrated in FIG. 3.

Typically, a dead time is set at the time of design and development of an electric power apparatus on the basis of the worst case considering variations in characteristics of a switching device and total operating conditions. The dead time affects an inverter output-voltage waveform and an output-current waveform, so that a shorter dead time is preferable. That is, an inverter outputs AC voltage and current using pulse width modulation, and increase or decrease of the output voltage is set in accordance with increase and decrease of a ratio of on-time to off-time of the pulse width modulation. Thus, when the dead time becomes a magnitude that cannot be ignored with respect to a cycle of the pulse width modulation, off-time of the switching device increases and the output-voltage decreases.

As illustrated in FIG. 3, the minimum dead time required when the transistor Q2 is turned off and the transistor Q1 is turned on is given by the following expression:

(d2+toff)−(d1+tdon)

where transmission delay time in each of the digital isolator U2 and the gate driving buffer U3 is indicated as d1, turn-on delay time until the gate signal S11 is provided to the transistor Q1 to allow drain voltage $Q1V_D$ to start falling and drain current $Q1I_D$ to start rising is indicated as tdon, transmission delay time in each of the digital isolator U7 and the gate driving buffer U8 is indicated as d2, and turn-off time of the transistor Q2 from at a time when the gate signal S21 of the transistor Q2 starts falling to a time when the drain current $Q2I_D$ starts falling is indicated as toff.

However, the turn-off time toff and the turn-on delay time tdon increase and decrease depending on variations in electric characteristics of the transistors Q1 and Q2, and operating conditions, so that a dead time dT is set to be larger than the minimum dead time as illustrated in FIG. 3. As a result, there is an actual dead time dT1 in which both of the transistors Q1 and Q2 are turned off.

When PWM control is performed, increase in a ratio of the actual dead time dT1 to one cycle of a carrier of the PWM control causes decrease in output voltage, and deviation in an output-voltage waveform and an output-current waveform from respective ideal values. As a result, it is necessary to perform correction processing such as compensation for a dead time using software in a microcontroller or a digital signal processor (DSP), which generates a gate on-off command signal and is not illustrated.

Typically, the dead time is determined at the time of design and development of an electric power apparatus, and it is set to a fixed value. However, increase in a variation of electrical characteristics of a switching device more than a value assumed at the time of the development, in mass production of the electric power apparatus, may cause an arm short due to the dead time that is insufficient.

Figure 4:
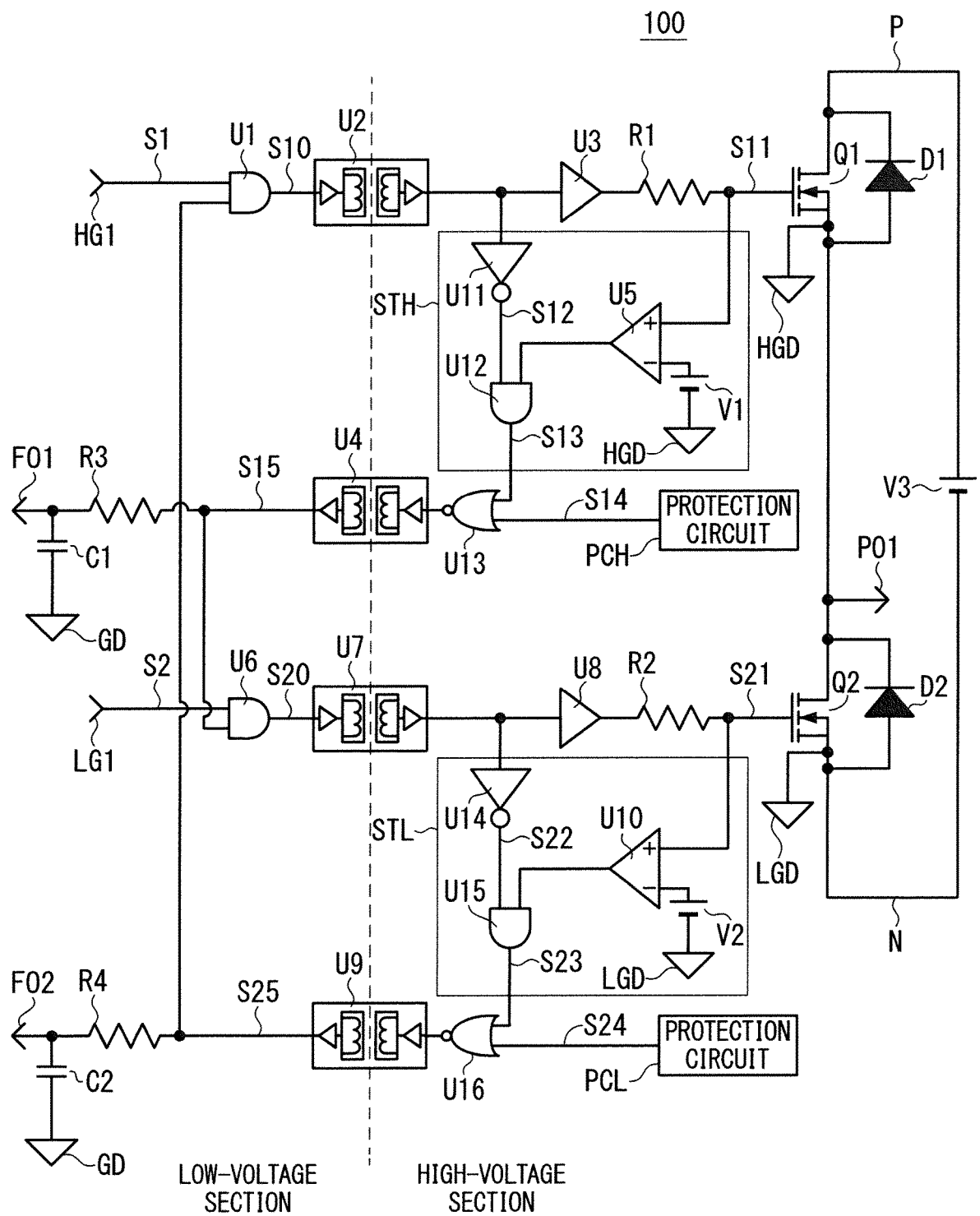
FIG. 4 is a circuit diagram illustrating a configuration of a half-bridge circuit having a dead time generation circuit according to a first embodiment of the present invention.

<First Embodiment>
<Device Configuration>
FIG. 4 is a circuit diagram illustrating a configuration of a half-bridge circuit 100 having a dead time generation circuit according to the present invention. In FIG. 4, the same components as those of the half-bridge circuit 90 described with reference to FIG. 1 are denoted by the same reference numerals, and duplicated description is eliminated.

As illustrated in FIG. 4, the half-bridge circuit 100 includes transistors Q1 and Q2 connected in series between P-N wires that are connected to a high-voltage power supply V3 to serve as main power supply lines.

The transistors Q1 and Q2 connected to the high-voltage power supply V3 and respective gate driving buffers U3 and U8 (gate driving circuit) are on a high-voltage side with respect to the high-voltage power supply V3. The transistors Q1 and Q2 are each connected at its source to a reference potential HGD, so that it is called a high-voltage section and is electrically insulated from a low-voltage section that operates with a low-voltage power supply. In the high-voltage section, the transistor Q1, a diode D1, the gate driving buffer U3, and a gate resistor R1 are collectively referred to as an upper device, and the transistor Q2, a diode D2, the gate driving buffer U8, and a gate resistor R2 are collectively referred to as a lower device.

Gate on-off command signals S1 and S2 input from signal input terminals HG1 and LG1 of the low voltage section are provided to gate driving buffers U3 and U8 of the high-voltage section using digital isolators U2 and U7 via logic circuits U1 and U6, respectively.

The high-voltage section of the half-bridge circuit 100 includes the following: an upper status-detection circuit STH composed of a comparator U5, an inverter U1f, a logic circuit U12, and a reference power supply V1; a lower status-detection circuit STL composed of a comparator U10, an inverter U14, a logic circuit U15, and a reference power supply V2; protection circuits PCH and PCL; and logic circuits U13 and U16.

The upper status-detection circuit STH outputs a status signal S13 indicating that the transistor Q1 is in a turn-off operation. The comparator U5 has a non-inverting input (+) connected to the gate of the transistor Q1, an inverting input (−) connected to a positive electrode of a reference power supply V1, and an output connected to the input of the logic circuit U 12. The reference power supply V1 is connected at its negative electrode to the reference potential HGD.

The inverter U11 is commonly connected at its input to an input of the gate driving buffer U3 to receive and invert an output of the digital isolator U2, and outputs an inverting-gate driving signal S12.

The inverting-gate driving signal S12 is input to another input of the logic circuit U12 to perform an AND calculation with an output of the comparator U5, and outputs the status signal S13.

The protection circuit PCH has a function of detecting an abnormality such as an excessive output current of the transistor Q1 due to a load short-circuit, overheating of the transistor Q1, and voltage reduction in a power supply in the gate driving circuit, to indicate that there is an abnormality with an error signal S14, and also has a soft shut-off function of softly shutting off the transistor Q1 when an abnormality is detected.

The soft shut-off is an operation to turn off the transistor Q1 at a switching speed slower than that of turning-off of the transistor Q1 using the gate driving buffer U3, and the transistor Q1 can be safely turned off by performing the soft shut-off.

The protection circuit PCH has functions and configurations that are included within a range of a well-known art, and that are remotely related to the present invention, so that detailed description thereof is eliminated, and a specific connection to the transistor Q1 is also eliminated.

The logic circuit U13 receives the status signal S13 and the error signal S14 to synthesize both the signals by performing NOR calculation, and inputs an output of the synthesized signal to a digital isolator U4. The digital isolator U4 is an insulating element for transmitting a signal of the high-voltage section to the low-voltage section, and a status signal S15 is output from the digital isolator U4.

Using an insulating element facilitates transmission of a signal of the high-voltage section to the low-voltage section and transmission of a signal of the low-voltage section to the high-voltage section.

The lower status-detection circuit STL outputs a status signal S23 indicating that the transistor Q2 is in a turn-off operation. The comparator U10 is connected at its non-inverting input (+) to a gate of the transistor Q2, at its inverting input (−) to a cathode of the reference power supply V2, and at its output to an input of the logic circuit U15. The reference power supply V2 is connected at its anode to a reference potential LGD.

The inverter U14 is commonly connected at its input to an input of the gate driving buffer U8 to receive and invert an output of the digital isolator U7, and outputs an inverting-gate driving signal S22.

The inverting-gate driving signal S22 is input to another input of the logic circuit U15 to perform an AND calculation with an output of the comparator U10, and outputs the status signal S23.

The protection circuit PCL has a function of detecting an abnormality such as an excessive output current of the transistor Q2 due to a load short-circuit, overheating of the transistor Q2, and a power supply voltage drop in the gate driving circuit, to indicate whether there is an abnormality with an error signal S24, and also has a function of softly shutting off the transistor Q2 when an abnormality is detected. The soft shut-off is an operation to turn off the transistor Q2 at a switching speed slower than that of turning-off of the transistor Q2 using the gate driving buffer U8, and the transistor Q2 can be safely turned off by performing the soft shut-off.

The protection circuit PCL has functions and configurations that are included within a range of a well-known art, and that are remotely related to the present invention, so that detailed description thereof is eliminated, and a specific connection to the transistor Q2 is also eliminated.

The logic circuit U16 receives the status signal S23 and the error signal S24 to synthesize both the signals by performing NOR calculation, and inputs an output of the synthesized signal to a digital isolator U9. The digital isolator U9 is an insulating element for transmitting a signal of the high-voltage section to the low-voltage section, and a status signal S25 is output from the digital isolator U9.

Using an insulating element facilitates transmission of a signal of the high-voltage section to the low-voltage section and transmission of a signal of the low-voltage section to the high-voltage section.

The logic circuit U1 of the low-voltage section of the half-bridge circuit 100 outputs a gate-driving output-command signal S10 for turning on the transistor Q1 only when the gate on-off command signal S1 instructs the transistor Q1 to be turned on and the status signal S25 indicates that the transistor Q2 is turned off, i.e., when the transistor Q2 is not turned on and is not in turn-off operation.

The logic circuit U6 of the low-voltage section of the half-bridge circuit 100 outputs a gate-driving output-command signal S20 for turning on the transistor Q2 only when the gate on-off command signal S2 instructs the transistor Q2 to be turned on and the status signal S15 indicates that the transistor Q1 is turned off, i.e., when the transistor Q1 is not turned on and is not in turn-off operation.

The digital isolator U4 is connected at its output to a low-pass filter composed of a resistor R3 and a capacitor C1. The capacitor C1 is connected between an end of the resistor R3 on an error-signal output terminal FO1 side and a reference potential GD of the low-voltage section.

This low-pass filter separates the error signal S14 output from the protection circuit PCH and the status signal S13 output from the status-detection circuit STH to output only the error signal S14 from the error-signal output terminal FO1. That is, while a typical turn-off operation period is several hundred nsec to several μsec, the error signal S24 output from the protection circuit PCH has a pulse width of several tens pec to several tens msec. Thus, the status signal S13 having a pulse width defined in the turn-off operation period and the error signal S14 are different from each other in pulse width, and can be easily separated by the low-pass filter.

The digital isolator U9 is connected at its output to a low-pass filter composed of a resistor R4 and a capacitor C2. The capacitor C2 is connected between an end of the resistor R4 on an error-signal output terminal FO2 side and a reference potential GD of the low-voltage section.

This low-pass filter separates the error signal S24 output from the protection circuit PCL and the status signal S23 output from the status-detection circuit STL to output only the error signal S24 from the error-signal output terminal FO2. That is, while a typical turn-off operation period is several hundred nsec to several μsec, the error signal S24 output from the protection circuit PCL has a pulse width of several tens pec to several tens msec. Thus, the status signal S23 having a pulse width defined in the turn-off operation period and the error signal S24 are different from each other in pulse width, and can be easily separated by the low-pass filter.

<Operation>

Figure 5:
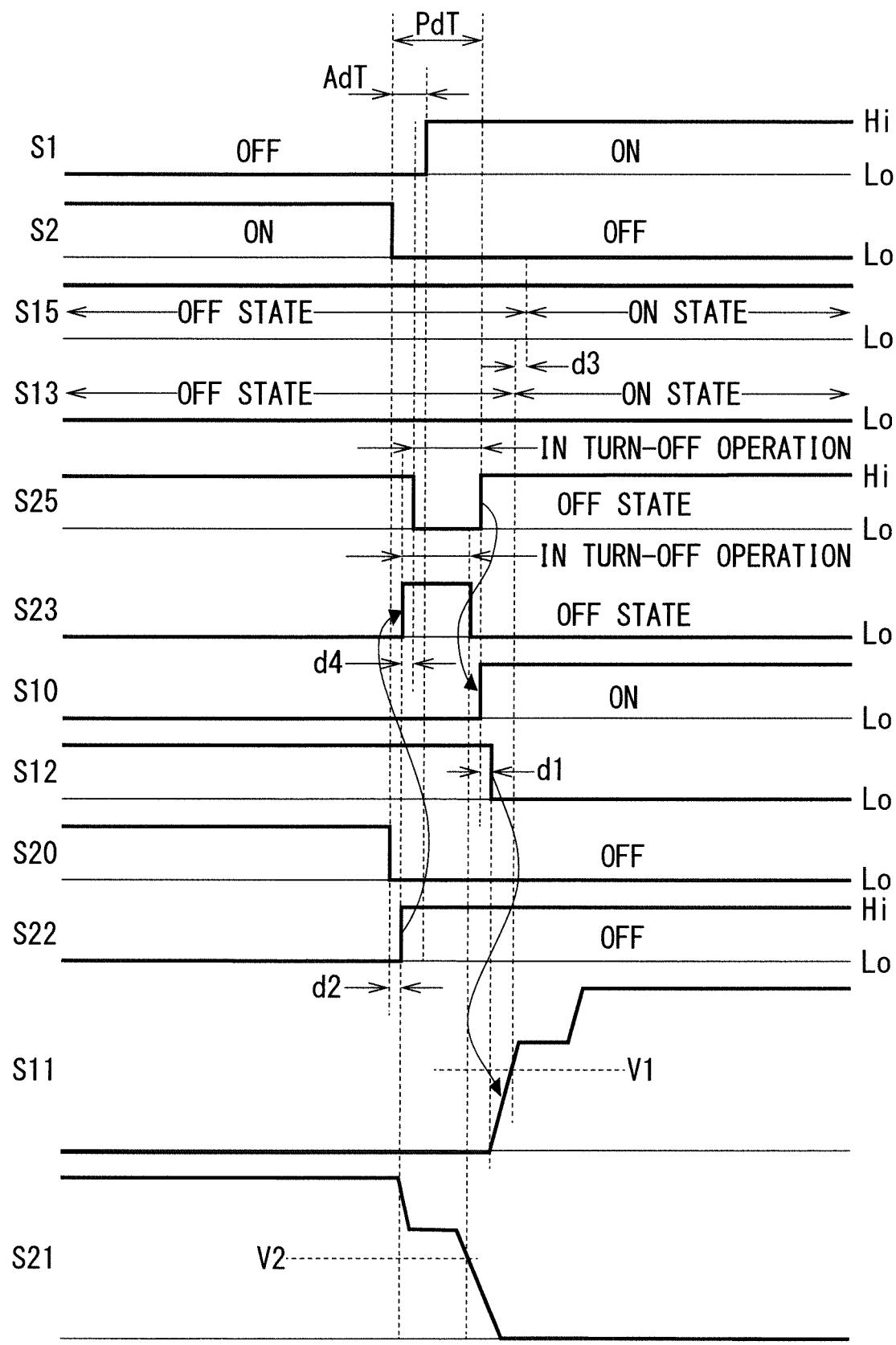
FIG. 5 is a timing chart illustrating switching operation of the half-bridge circuit having the dead time generation circuit according to the first embodiment of the present invention.

Next, referring to FIG. 4, switching operation of the half-bridge circuit 100 will be described with reference to the timing chart illustrated in FIG. 5. FIG. 5 illustrates each timing when the transistor Q2 is turned off or the transistor Q1 is turned on. In the half-bridge circuit 100 illustrated in FIG. 4, transmission delay time in each logic circuit is shorter than transmission delay time in each isolation element and can be neglected. Thus, the timing chart illustrated in FIG. 5 shows a result in consideration of only transmission delay time in each insulating element.

As illustrated in FIG. 5, the gate on-off command signals S1 and S2 are each generated by adding a dead time AdT. The gate on-off command signals S1 and S2 are generated by a microcontroller or a DSP (not illustrated in FIG. 4) and input to the half-bridge circuit 100.

The dead time AdT is set longer than transmission delay time in a path passing through the logic circuit U1, the digital isolator U4, the inverter U11, the logic circuits U12 and U13, and the digital isolator U2 in FIG. 4 as well as transmission delay time in a path passing through the logic circuit U6, the digital isolator U7, the inverter U14, the logic circuits U15 and U16, and the digital isolator U9 in FIG. 4.

As illustrated in FIG. 5, when the gate on-off command signal S2 becomes a low-potential state (Lo) instructing the transistor Q2 to be turned off, the gate-driving output-command signal S20 output by the logic circuit U6 becomes the Lo instructing the transistor Q2 to be turned off regardless of a potential state of the gate on-off command signal S1, and then the transistor Q2 is turned off.

The lower status-detection circuit STL compares a gate voltage of the transistor Q2 and a reference voltage V2 (equivalent to threshold voltage of the transistor Q2) of the reference power supply V2 using the comparator U10 to input a comparison result to the logic circuit U15, and performs an AND calculation with the inverting-gate driving signal S22 output from the inverter U14 in the logic circuit U15. The inverting-gate driving signal S22 is output after being delayed by the transmission delay time d2 in the digital isolator U7.

The logic circuit U15 outputs the status signal S23 as a high potential state (Hi), indicating that the transistor Q2 is in a turn-off operation in a period satisfying the following conditions: the inverting-gate driving signal S22 is the Hi; and the gate voltage of the transistor Q2 is higher than the reference voltage. When the transistor Q2 is not in the turn-off operation, the status signal S23 is set to the Lo.

The status signal S23 is input to the logic circuit U16 together with the error signal S24. When the status signal S23 is the Hi by the NOR calculation, an output is set to the Lo. Thus, when the status signal S23 is the Hi, the status signal S25 generated by inverting the status signal S23 is output after being delayed by the transmission delay time d4 in the digital isolator U9. The status signal S25 is input to the logic circuit U1, and is also input to the low-pass filter composed of the resistor R4 and the capacitor C2 to allow the status signal S23 to be separated, so that only the error signal S24 is output from the error-signal output terminal FO2.

As illustrated in FIG. 5, the gate on-off command signal S1 becomes the Hi after a delay of the dead time AdT from the falling edge of the gate on-off command signal S2. However, the transistor Q2 is already in the turn-off operation (Lo), as a result of the AND calculation in the logic circuit U1, the gate-driving output-command signal S10 output from the logic circuit U1 maintains the Lo instructing the transistor Q1 to be turned off.

When the gate signal S21 becomes less than the threshold voltage (equivalent to the reference power supply V2), the transistor Q2 is turned off. Then, the status signal S23 output from the logic circuit U15 is inverted to the Lo, and the status signal S25 output from the digital isolator U9 is also inverted to the Hi.

As a result, the gate driving output command signal S10 output from the logic circuit U1 is inverted to the Hi instructing the transistor Q1 to be turned on, and the transistor Q1 is turned on.

The upper status-detection circuit STH compares a gate voltage of the transistor Q1 and a reference voltage V1 (equivalent to threshold voltage of the transistor Q1) of the reference power supply V1 using the comparator U5 to input a comparison result to the logic circuit U12, and performs an AND calculation with the inverting-gate driving signal S12 output from the inverter U11 in the logic circuit U12. The inverting-gate driving signal S12 is output after being delayed by the transmission delay time d1 in the digital isolator U2.

FIG. 5 does not indicate timing at which the transistor Q1 is turned off, so that the status signal S13 indicating that the transistor Q1 is in a turn-off operation maintains the Lo and the status signal S15 maintains the Hi. While the status signal S13 maintains the Lo, the transistor Q1 is turned on when the gate signal S11 becomes equal to or higher than the threshold voltage (equal to the reference power supply V1). Then, the status signal S15 indicates that the transistor Q1 is turned on, after being delayed by the transmission delay time d3 in the digital isolator U4, after the transistor Q1 is turned on.

As described above, the predetermined dead time AdT may be added to the gate on-off command signals S1 and S2 that are externally applied, and there is an actual dead time that is a dead time PdT generated by switching on and off of the gate-driving output-command signal S10 output from the logic circuit U1 and the gate-driving output-command signal S20 output from the logic circuit U6 output.

According to the prior art, when a resistance value of each of the gate resistors R1 and R2 is changed by the soft shut-off function of the protection circuit to change the turn-on and turn-off times of the corresponding one of the transistors Q1 and Q2, a dead time to be added to each of the gate on-off command signals S1 and S2 needs to be adjusted each time. In contrast, the half-bridge circuit 100 of the first embodiment allows the actual dead time PdT to extend or shorten in accordance with the increase and decrease of the turn-on and turn-off times of each of the transistors Q1 and Q2, so that a dead time to be added to each of the gate on-off command signals S1 and S2 does not need to be adjusted.

This is because there are provided the upper status-detection circuit STH and the lower status-detection circuit STL to determine whether the corresponding transistors Q1 and Q2 are in turn-off operation on the basis of gate voltages of the respective transistors Q1 and Q2 under determination conditions using the inverting-gate driving signals of the respective gate-driving output-command signals S10 and S20 and the gate voltages of the respective transistors Q1 and Q2. When the resistance values of the respective gate resistors R1 and R2 change due to the soft shut-off function of the protection circuit to change the turn-on and turn-off times of the corresponding transistors Q1 and Q2, the periods of the respective status signals S15 and S25 indicating being in turn-off operation extend or shorten accordingly to automatically change the gate-driving output-command signals S10 and S20 generated on the basis of the status signals S15 and S25, respectively.

This causes the soft shutoff function by the protection circuit to operate immediately before the transistors Q1 and Q2 are turned on and off on the basis of the corresponding gate on-off command signals S1 and S2. Thus, even when the turn-off time of each of the transistors Q1 and Q2 increases, the actual dead time extends to enable preventing an arm short.

As described above, the upper status-detection circuit STH and the lower status-detection circuit STL each generate the actual dead time PdT, so that they can be each referred to as a dead-time generation circuit.

When the reference voltage V1 (equivalent to the threshold voltage of the transistor Q1) of the reference power supply V1 and the reference voltage V2 (equivalent to the threshold voltage of the transistor Q2) of the reference power supply V2 are each set equal to or lower than the gate voltage at the time when the transistors Q1 and Q2 are each turned off to sufficiently attenuate its output current, the actual dead time PdT to be generated can be minimized in width. In addition, decrease in the voltages of the reference voltages V1 and V2 extends the actual dead time PdT, and increase in the voltages of the reference voltages V1 and V2 reduces the actual dead time PdT to be generated. This enables the dead time to be finely adjusted by changing the reference voltages V1 and V2.

Examples of the configuration of the reference voltages V1 and V2 include a configuration in which voltage of a fixed voltage supply is divided by a variable resistor, and a configuration using a variable voltage supply. In the former case, output voltage is adjusted by adjusting the variable resistor that divides voltage of its built-in reference voltage supply. In the latter case, a DA converter is used as a built-in reference voltage supply to adjust output voltage of the DA converter by adjusting a digital signal input to the DA converter.

While it is conventionally necessary to provide an independent isolating element (e.g., a photocoupler) for transmitting a status signal from the high-voltage section to the low-voltage section, the digital isolator U4 and U9 are used together with insulating elements for transmitting the respective error signals S14 and S24 from the corresponding protection circuits PCH and PCL in the present embodiment, thereby enabling the half-bridge circuit 100 to be reduced in size and cost.

In addition, while transmission delay time of the photocoupler is several μsec to several tens μsec, transmission delay time of the digital isolator is several tens of nsec, and thus the signal transmission delay can be reduced.

<Second Embodiment>
<Device Configuration>

Figure 6:
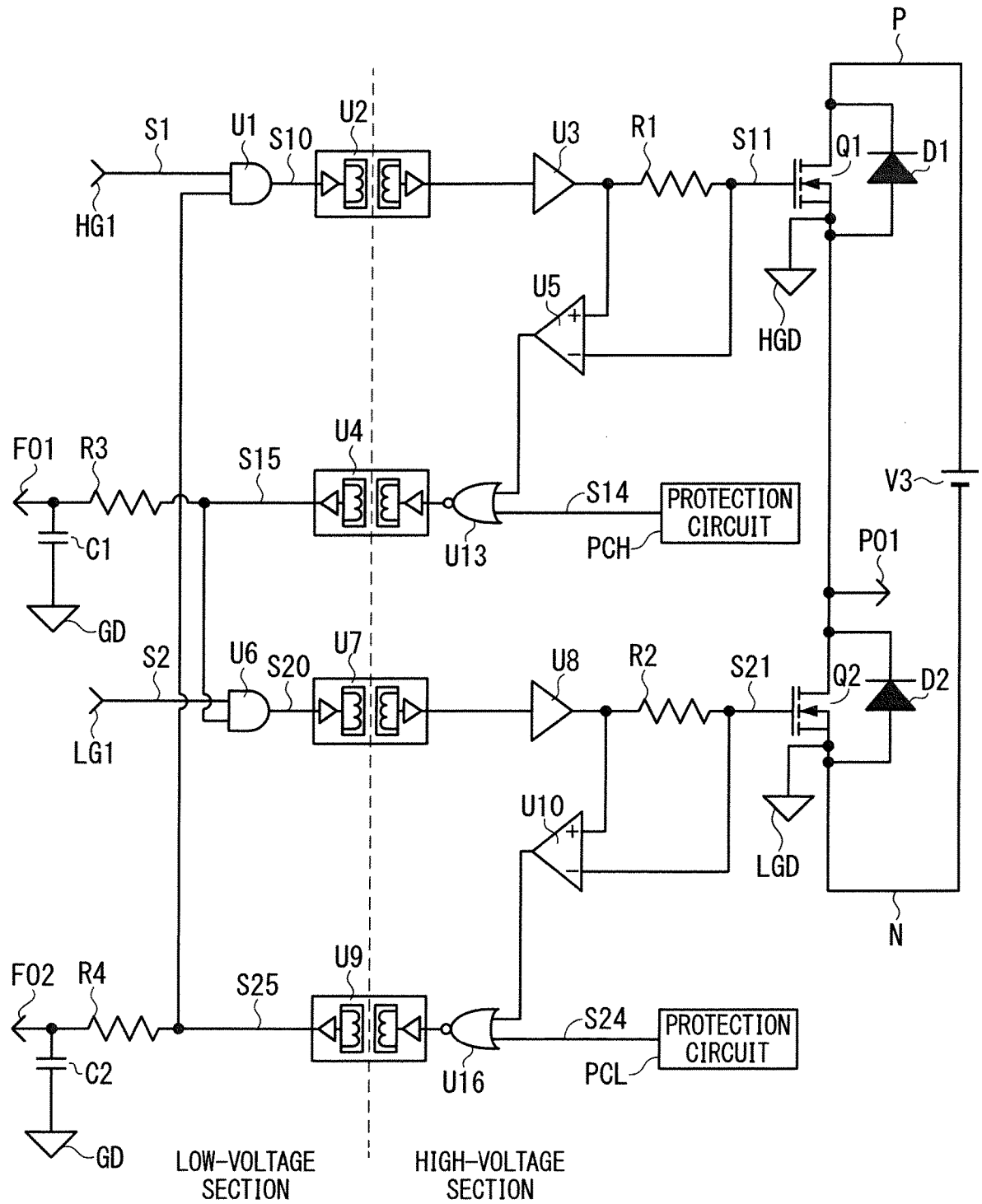
FIG. 6 is a circuit diagram illustrating a configuration of a half-bridge circuit having a dead time generation circuit according to a second embodiment of the present invention.

FIG. 6 is a circuit diagram illustrating a configuration of a half-bridge circuit 200 having a dead-time generation circuit according to the present invention. In FIG. 6, the same components as those of the half-bridge circuit 100 of the first embodiment described with reference to FIG. 4 are denoted by the same reference numerals, and duplicate description is eliminated.

The half-bridge circuit 200 illustrated in FIG. 6 includes an upper status-detection circuit STH and a lower status-detection circuit STL that are each composed of only the corresponding one of comparators U5 and U10.

That is, the comparator U5 is connected at its non-inverting input (+) to a gate of a transistor Q1, at its inverting input (−) to an output of a gate driving buffer U3, and at its output to an input of a logic circuit U13. The logic circuit U13 has the other input to which an error signal S14 output from a protection circuit PCH is input.

The comparator U10 is connected at its non-inverting input (+) to a gate of a transistor Q2, at its inverting input (−) to an output of a gate driving buffer U8, and at its output to an input of a logic circuit U16. The logic circuit U16 has the other input to which an error signal S24 output from a protection circuit PCL is input.

<Operation>

While switching operation of the half-bridge circuit 200 is basically the same as the switching operation of the half-bridge circuit 100 described with reference to FIG. 5, the comparators U5 and U10 each output a status signal. That is, during turn-off periods of the respective transistors Q1 and Q2, the gate driving buffers U3 and U8 discharge gate charges of the transistors Q1 and Q2 via the gate resistors R1 and R2, respectively. This causes a large voltage drop at the gate resistor (R1 or R2) connected to the corresponding one of the transistors Q1 and Q2 during its turn-off period. The comparators U5 and U10 each detect the voltage drop and output a status signal indicating whether the corresponding one of the transistors Q1 and Q2 is in the turn-off period.

Each of the gate driving buffers U3 and U8 includes an inverter composed of a switching device connected in series between a power supply potential and a reference potential. When the transistors Q1 and Q2 are each turned off, a transistor on a power supply potential side of the inverter is turned off and a transistor on a reference potential side thereof is turned on to discharge gate charges of the respective transistors Q1 and Q2, thereby turning off the transistors Q1 and Q2.

The comparators U5 and U10 each output a status signal to be the Hi only when a large potential difference is generated across each of the gate resistors R1 and R2, so that the status signal has a waveform similar to that of each of the status signals S13 and S23 illustrated in FIG. 5. A potential difference generated across each of the gate resistors R1 and R2 during turning-on and turning-off of the corresponding one of the transistors Q1 and Q2 is small, so that it is not detected.

The upper status-detection circuit STH and the lower status-detection circuit STL each generate an actual dead time PdT (FIG. 5) as with the first embodiment, so that they can be each referred to as a dead-time generation circuit.

According to the half-bridge circuit 200 of the second embodiment described above, in addition to the effect of the half-bridge circuit 100 of the first embodiment, the upper status-detection circuit STH and the lower status-detection circuit STL are respectively provided with only the comparators U5 and U10 to enable achieving further reduction in circuit scale and cost.

<Third Embodiment>

Figure 7:
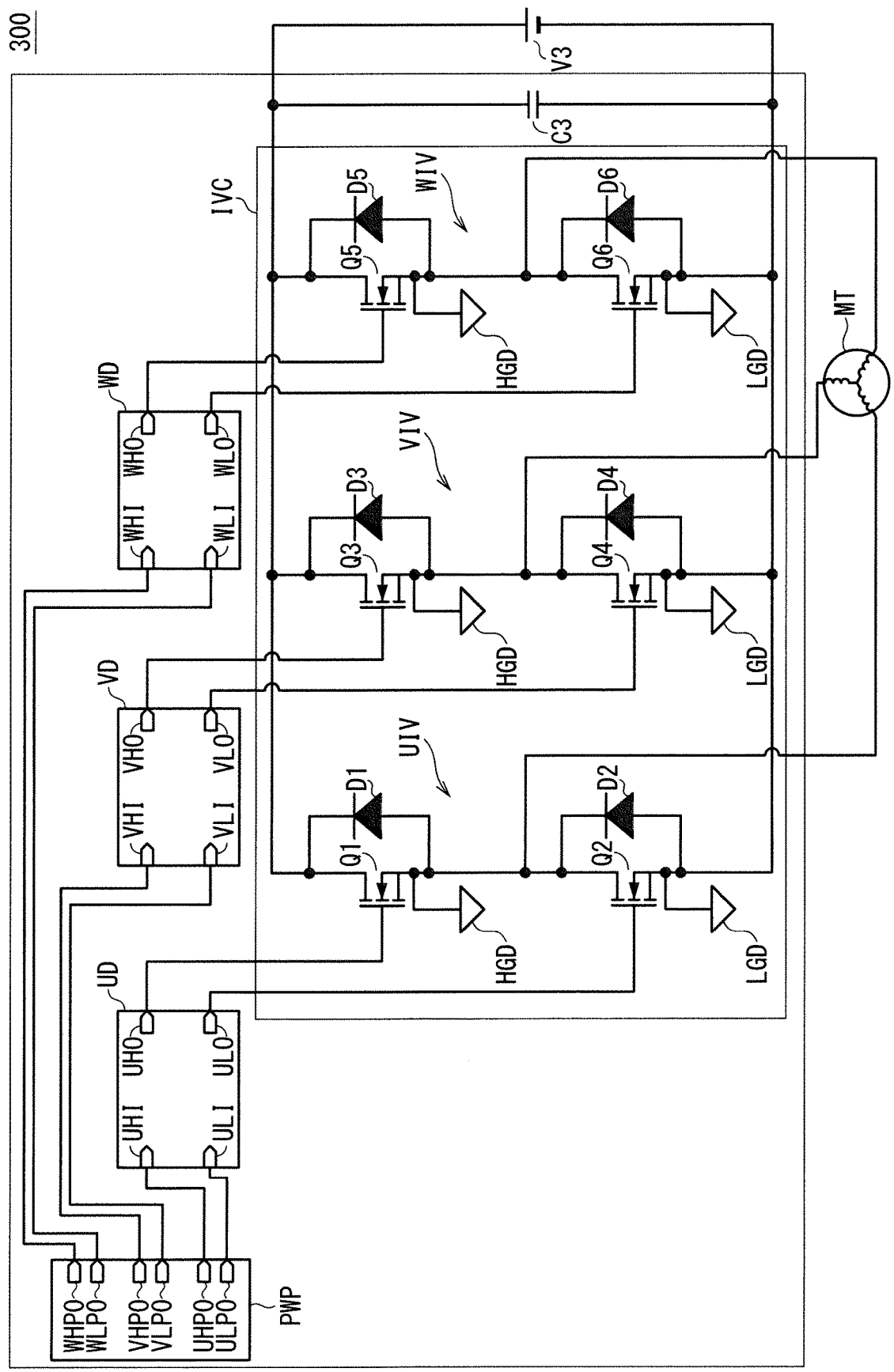
FIG. 7 is a diagram illustrating a configuration of a three-phase inverter having a dead time generation circuit according to a third embodiment of the present invention.

While an example in which a dead-time generation circuit is incorporated in a half-bridge circuit is illustrated in the first and second embodiments described above, two sets of the half bridge circuit are connected in parallel to form an H bridge circuit, and three sets thereof are connected in parallel to form a three phase inverter. FIG. 7 is a diagram illustrating a configuration of a three-phase inverter 300 incorporating a dead-time generation circuit according to a third embodiment.

The three-phase inverter 300 illustrated in FIG. 7 includes a U-phase inverter UIV, a V-phase inverter VIV, and a W-phase inverter WIV that are connected in parallel between P-N wires that are connected to a high-voltage power supply V3 to serve as main power supply lines. Between the P-N wires, a smoothing capacitor C3 is connected. A section including the U-phase inverter UIV, the V-phase inverter VIV, and the W-phase inverter WIV is referred to as an inverter section IVC in a narrow sense.

The U-phase inverter UIV includes transistors Q1 and Q2 connected in series between the P-N wires, and diodes D1 and D2 connected in anti-parallel to the transistors Q1 and Q2, respectively. The transistors Q1 and Q2 are respectively connected at their sources to reference potentials HGD and LGD with reference to the high-voltage power supply V3. A connection node between a drain of the transistor Q1 and a source of the transistor Q2 serves as an output node POU, and is connected to a U-phase coil of an external three-phase motor MT.

The V-phase inverter VIV includes transistors Q3 and Q4 connected in series between the P-N wires, and diodes D3 and D4 connected in anti-parallel to the transistors Q3 and Q4, respectively. The transistors Q3 and Q4 are respectively connected at their sources to reference potentials HGD and LGD with reference to the high-voltage power supply V3. A connection node between a drain of the transistor Q3 and a source of the transistor Q4 serves as an output node POV, and is connected to a V-phase coil of the external three-phase motor MT.

The W-phase inverter WIV includes transistors Q5 and Q6 connected in series between the P-N wires, and diodes D5 and D6 connected in anti-parallel to the transistors Q5 and Q6, respectively. The transistors Q5 and Q6 are respectively connected at their sources to reference potentials HGD and LGD with reference to the high-voltage power supply V3. A connection node between a drain of the transistor Q5 and a source of the transistor Q6 serves as an output node POW, and is connected to a W-phase coil of the external three-phase motor MT.

The U-phase inverter UIV is driven by a U-phase driver UD, and the U-phase driver UD is connected at its output terminals UHO and ULO to gates of the transistors Q1 and Q2, respectively. Then, the U-phase driver UD is connected at its input terminals UHI and ULI to U-phase PWP-signal terminals UHPO and ULPO of a PWM-signal creating device PWP, respectively.

The V-phase inverter VIV is driven by a V-phase driver VD, and the V-phase driver VD is connected at its output terminals VHO and VLO to gates of the transistors Q3 and Q4, respectively. Then, the V-phase driver VD is connected at its input terminals VHI and VLI to V-phase PWP-signal terminals VHPO and VLPO of the PWM-signal creating device PWP, respectively.

The W-phase inverter WIV is driven by a W-phase driver WD, and the W-phase driver WD is connected at its output terminals WHO and WLO to gates of the transistors Q3 and Q4, respectively. Then, the W-phase driver WD is connected at its input terminals WHI and WLI to W-phase PWP-signal terminals WHPO and WLPO of the PWM-signal creating device PWP, respectively.

Figure 8:
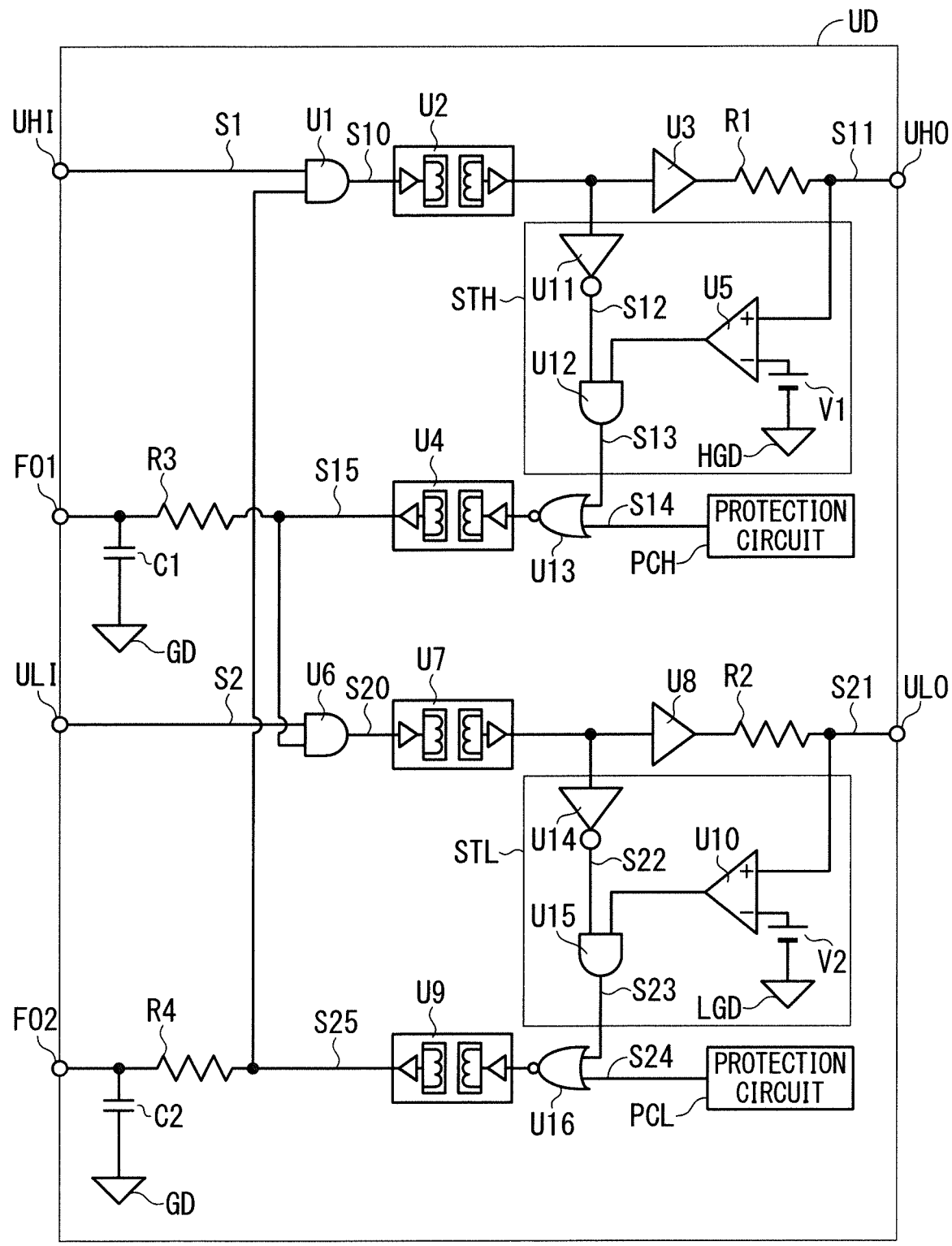
FIG. 8 is a circuit diagram illustrating an internal configuration of a U-phase inverter.

For example, the U-phase inverter UIV corresponds to the inverter of the half-bridge circuit 100 illustrated in FIG. 4, and the U-phase driver UD corresponds to a section other than the inverter of the half-bridge circuit 100. FIG. 8 illustrates an internal configuration of the U-phase inverter UIV. In FIG. 8, the same components as those of the half-bridge circuit 100 described with reference to FIG. 4 are denoted by the same reference numerals, and duplicated description is eliminated.

In the U-phase inverter UIV illustrated in FIG. 8, the signal input terminals HG1 and LG1 of the low-voltage section illustrated in FIG. 4 correspond to the input terminals UHI and ULI, respectively, and the output terminals UHO and ULO are respectively connected to wires to which the corresponding gate signal S11 and S21 are provided. While FIG. 8 illustrates the error-signal output terminals FO1 and FO2, FIG. 7 eliminates them. The V-phase driver VD and the W-phase driver WD each also have an internal structure similar to that of the U-phase driver UD.

As described above, the three-phase inverter 300 incorporates the dead-time generation circuit, so that a dead time extends or shortens in accordance with increase and decrease in turn-on time and turn-off time of each transistor even when each phase inverter in a inverter section IVC is different in switching speed. As a result, it is unnecessary to adjust a dead time to be added to a gate on-off command signal output from the PWM-signal creating device PWP. Thus, dead time correction processing by software in the PWM-signal creating device PWP such as a microcontroller, a digital signal processor (DSP), or the like, becomes unnecessary, so that development costs spent on software development and the like are reduced. In addition, reduction in load of the PWM-signal creating device PWP enables the device to be substituted for a device of a lower speed and lower cost, so that manufacturing costs can be reduced.

While an example of the U-phase driver UD to which the half-bridge circuit 100 of the first embodiment is applied is described above, it is needless to say that the half-bridge circuit 200 of the second embodiment may be applied.

<Fourth Embodiment>

Figure 9:
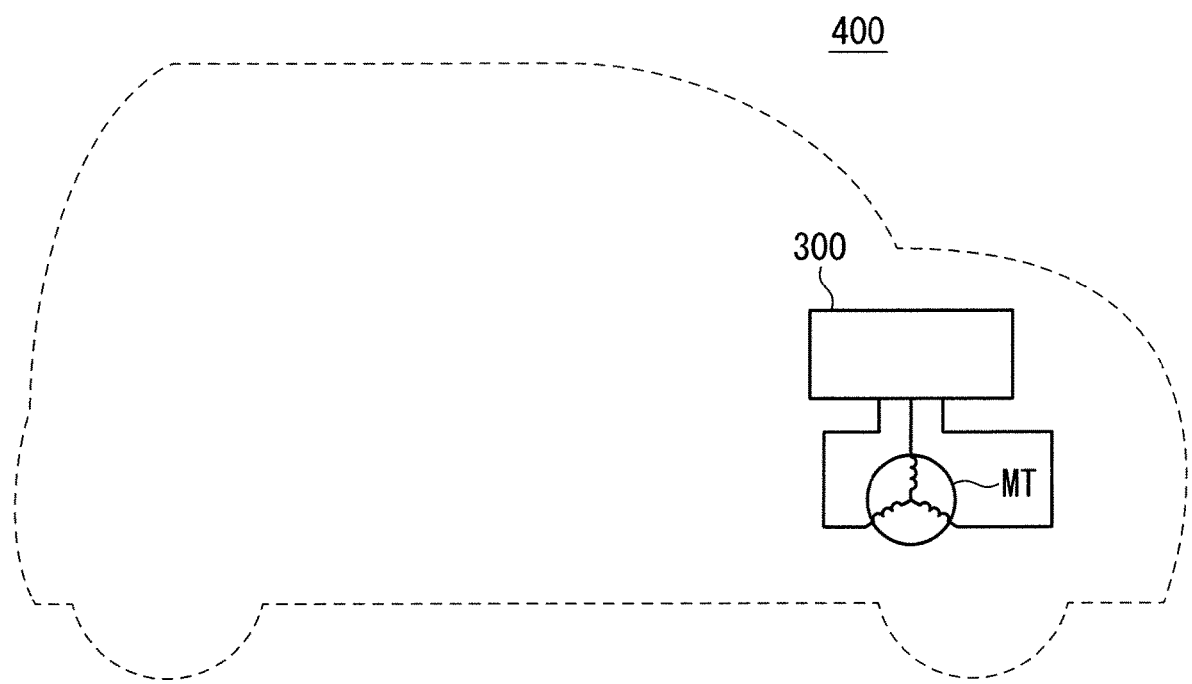
FIG. 9 is a conceptual diagram illustrating a configuration of a vehicle according to a fourth embodiment of the present invention.

FIG. 9 is a conceptual diagram illustrating a configuration of a vehicle 400 according to a fourth embodiment in which a motor is controlled using the three-phase inverter 300 incorporating a dead-time generation circuit.

An electric vehicle such as a hybrid vehicle, a plug-in hybrid vehicle, an electric vehicle, a fuel cell vehicle, or the like, as well as an automobile driven by an internal combustion engine, provided with a regenerative motor such as a starter-generator, includes a running motor and an electric-power regenerative motor. FIG. 9 illustrates a configuration using the three-phase inverter 300 incorporating a dead-time generation circuit for driving control of a three-phase motor MT of each of them.

While a hybrid vehicle, a plug-in hybrid vehicle, an electric vehicle, a fuel cell vehicle, and an automobile provided with a starter-generator or the like, each include a motor with an output of 1 kW or more, the motor has a large load fluctuation and alternately repeats power running and regeneration. In addition, a coasting state without power running and regeneration frequently occurs. In such a state, an inverter driving the motor is close to in no-load operation, and an output current thereof does not flow at all or has a small value of several tenths of a rated current to several hundredths thereof.

Such a coasting state may cause switching speed of a switching device in the inverter to be faster than that during normal power running and regeneration, so that induced current may be generated in each part of the inverter to cause malfunction.

In contrast, when the three-phase inverter 300 incorporating a dead time generation circuit is used for driving control of the three-phase motor MT, a soft shut-off function of a protection circuit works due to malfunction immediately before on and off of a switching device constituting the inverter is switched by a gate on-off command signal. This enables a dead time to automatically extend to prevent an arm short even when turn-off time of the switching device increases. In addition, the three-phase inverter 300 can reduce development costs and manufacturing costs to enable reduction in development and manufacturing costs of electric vehicles and automobiles.

In the present invention, each of the embodiments may be freely combined, or and any of the embodiments may be appropriately modified and eliminated within the scope of the invention.

The invention claimed is:

1. A semiconductor device comprising:
   first and second switching devices connected in series between a first potential and a second potential lower than the first potential to operate complementarily;
   a first gate driving circuit that performs driving control of the first switching device;
   a second gate driving circuit that performs driving control of the second switching device;
   a first status-detection circuit having functions of not only detecting whether the first switching device is in turn-off operation to output a result of the detection as a first status signal, but also generating a dead time of on-off operation of each of the first and second switching devices;
   a second status-detection circuit having functions of not only detecting whether the second switching device is in turn-off operation to output a result of the detection as a second status signal, but also generating a dead time of on-off operation of each of the first and second switching devices;
   first and second input terminals to which first and second on-off command signals for turning on and off the first and second switching devices are input, respectively;
   a first logic circuit that receives the first on-off command signal and the second status signal, and that outputs the first on-off command signal as a signal for turning on the first switching device only when the second status signal indicates that the second switching device is not in turn-off operation;
   a second logic circuit that receives the second on-off command signal and the first status signal, and that outputs the second on-off command signal as a signal for turning on the second switching device only when the first status signal indicates that the first switching device is not in turn-off operation;
a first protection circuit that detects an abnormality of the first switching device to output a first error signal indicating that the first switching device is abnormal;
a fifth logic circuit that synthesizes the first status signal and the first error signal to output the synthesized signal as the first status signal;
a second protection circuit that detects an abnormality of the second switching device to output a second error signal indicating that the second switching device is abnormal;
a sixth logic circuit that synthesizes the second status signal and the second error signal to output the synthesized signal as the second status signal;
a first filter circuit that separates the first error signal from the first status signal in which the first error signal is synthesized and outputs a first resultant signal; and
a second filter circuit that separates the second error signal from the second status signal in which the second error signal is synthesized and outputs a second resultant signal.

2. The semiconductor device according to claim 1, wherein
the first status-detection circuit includes a first comparator that compares voltages at both ends of a first gate resistor connected to a gate of the first switching device, the first comparator outputting the first status signal indicating that the first switching device is in turn-off operation in a period in which the first gate resistor has a voltage drop, and
the second status-detection circuit includes a second comparator that compares voltages at both ends of a second gate resistor connected to a gate of the second switching device, the second comparator outputting the second status signal indicating that the second switching device is in turn-off operation in a period in which the second gate resistor has a voltage drop.

3. The semiconductor device according to claim 1, wherein
the first protection circuit has a soft shut-off function of turning off the first switching device at a switching speed slower than that of turning off by the first gate driving circuit when an abnormality of the first switching device is detected, and
the second protection circuit has a soft shut-off function of turning off the second switching device at a switching speed slower than that of turning off by the second gate driving circuit when an abnormality of the second switching device is detected.

4. The semiconductor device according to claim 1, wherein
the first status signal in which the first error signal is synthesized is input to the first filter circuit via a first insulating element, and
the second status signal in which the second error signal is synthesized is input to the second filter circuit via a second insulating element.

5. The semiconductor device according to claim 4, wherein the first and second insulating elements are each composed of a magnetic coupler that performs isolation using magnetic coupling.

6. An inverter comprising the semiconductor device according to claim 1.

7. An automobile that controls a running motor and an electric-power regenerative motor by using the inverter according to claim 6.

8. A semiconductor device comprising:
first and second switching devices connected in series between a first potential and a second potential lower than the first potential to operate complementarily;
a first gate driving circuit that performs driving control of the first switching device;
a second gate driving circuit that performs driving control of the second switching device:
a first status-detection circuit having functions of not only detecting whether the first switching device is in turn-off operation to output a result of the detection as a first status signal, but also generating a dead time of on-off operation of each of the first and second switching devices;
a second status-detection circuit having functions of not only detecting whether the second switching device is in turn-off operation to output a result of the detection as a second status signal, but also generating a dead time of on-off operation of each of the first and second switching devices;
first and second input terminals to which first and second on-off command signals for turning on and off the first and second switching devices are input, respectively;
a first logic circuit that receives the first on-off command signal and the second status signal, and that outputs the first on-off command signal as a signal for turning on the first switching device only when the second status signal indicates that the second switching device is not in turn-off operation;
a second logic circuit that receives the second on-off command signal and the first status signal, and that outputs the second on-off command signal as a signal for turning on the second switching device only when the first status signal indicates that the first switching device is not in turn-off operation,
wherein
the first status-detection circuit includes
a first comparator that compares a gate voltage of the first switching device with a predetermined first reference voltage, and
a third logic circuit that receives a first inversion signal generated by inverting the first on-off command signal and an output signal of the first comparator, and that outputs the first status signal indicating that the first switching device is in turn-off operation in a period satisfying the following conditions: the first inversion signal is a signal for turning off the first switching device; and the first switching device has a gate voltage higher than the first reference voltage,
the second status-detection circuit includes
a second comparator that compares a gate voltage of the second switching device with a predetermined second reference voltage, and
a fourth logic circuit that receives a second inversion signal generated by inverting the second on-off command signal and an output signal of the second comparator, and that outputs the second status signal indicating that the second switching device is in turn-off operation in a period satisfying the following conditions: the second inversion signal is a signal for turning off the second switching device; and the second switching device has a gate voltage higher than the second reference voltage.

9. An inverter comprising the semiconductor device according to claim 8.

10. An automobile that controls a running motor and an electric-power regenerative motor by using the inverter according to claim 9.

* * * * *